US009735760B1

(12) United States Patent
Zhou et al.

(10) Patent No.: US 9,735,760 B1
(45) Date of Patent: Aug. 15, 2017

(54) DEVICES WITH PUSH-PULL DRIVERS

(71) Applicant: Hewlett Packard Enterprise Development LP, Houston, TX (US)

(72) Inventors: Dacheng Zhou, Fort Collins, CO (US); Zhubiao Zhu, Fort Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/142,013

(22) Filed: Apr. 29, 2016

(51) Int. Cl.
*H03K 3/037* (2006.01)
*H03K 3/356* (2006.01)
*H03K 5/13* (2014.01)
*H03K 5/00* (2006.01)

(52) U.S. Cl.
CPC ....... *H03K 3/037* (2013.01); *H03K 3/356113* (2013.01); *H03K 5/13* (2013.01); *H03K 2005/00195* (2013.01)

(58) Field of Classification Search
CPC ............. H03K 19/0005; H03K 17/162; H03K 5/2481; H03K 19/1737; H03K 3/011; H03K 3/012; H03K 3/3545; H03K 3/35625
USPC .......................... 327/108, 109, 110, 111, 112
See application file for complete search history.

(56) References Cited

U.S. PATENT DOCUMENTS

| 5,528,166 | A | 6/1996 | Iikbahar |
| 6,448,807 | B1 | 9/2002 | Ahsanullah |
| 6,759,868 | B2 | 7/2004 | Helt et al. |
| 7,317,333 | B1 | 1/2008 | Zhou et al. |
| 8,832,487 | B2 | 9/2014 | Fiedler |
| 2009/0267640 | A1* | 10/2009 | Kuzmenka ........ H04L 25/03343 326/30 |

OTHER PUBLICATIONS

Sredojevic, R. et al. "Fully Digital Transmit Equalizer with Dynamic Impedance Modulation", IEEE Journal of Solid-State Circuits, vol. 46, No. 8, pp. 1857-1869, Aug. 2011.

\* cited by examiner

*Primary Examiner* — John Poos
(74) *Attorney, Agent, or Firm* — Tong, Rea, Bentley & Kim, LLC

(57) ABSTRACT

In one example, a device may include a first push-pull driver with a first impedance and a push-pull driver unit with a second push-pull driver having a second impedance. The push-pull driver unit may be in parallel with the first push-pull driver. The device may further include a pulse generating unit to activate the push-pull driver unit for a delay time following an edge transition in an input signal. In one example, the device may have an output impedance that is less than the first impedance when the push-pull driver unit is activated.

20 Claims, 4 Drawing Sheets

DEVICES WITH PUSH-PULL DRIVERS

BACKGROUND

Packaging technologies such as die stacking through bond wire or through-silicon-via (TSV) allow multiple memory dies to be stacked into a single package with shared memory address and control pins. This may lead to large capacitive loading at the receiver, for example, up to 45 pico-farads (pF) and greater.

DETAILED DESCRIPTION

Figure 1:
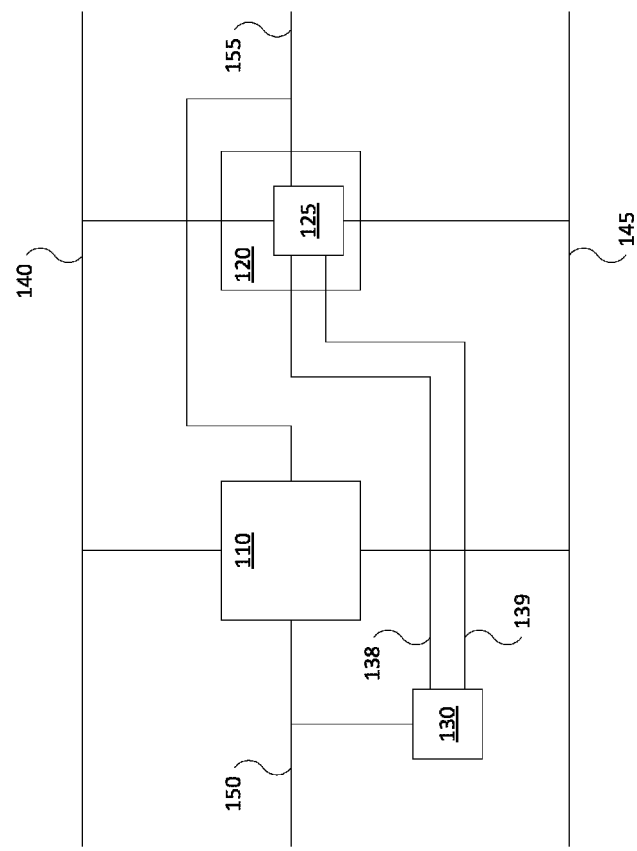
FIG. 1 illustrates a block diagram of an example device including a push-pull driver, a push-pull driver unit, and a pulse generating unit.

In one example, the present disclosure describes a device that may include a first push-pull driver with a first impedance and a push-pull driver unit with a second push-pull driver having a second impedance. The push-pull driver unit may be in parallel with the first push-pull driver. The device may further include a pulse generating unit to activate the push-pull driver unit for a delay time following an edge transition in an input signal. In one example, the device may have an output impedance that is less than the first impedance when the push-pull driver unit is activated.

In another example, the present disclosure describes a device that may include a first push-pull driver with a first impedance and a second push-pull driver having a second impedance. The second push-pull driver may be in parallel with the first push-pull driver. The device may further include a pulse generating unit to activate the second push-pull driver for a delay time following an edge transition in an input signal. In one example, the device may have an output impedance that is less than the first impedance when the second push-pull driver is activated.

In a further example, the present disclosure describes a device that may include a first push-pull driver having a first impedance. The first push-pull driver may be coupled to a positive power supply and to a negative power supply. In one example, gates of a first p-type field effect transistor (pFET) and a first n-type field effect transistor (nFET) of the first push-pull driver may be coupled to an input line of the device. The device may also include a second push-pull driver coupled to the positive power supply and to the negative power supply in parallel with the first push-pull driver. The second push-pull driver may have a second impedance. In one example, the first push-pull driver and the second push-pull driver may be coupled to an output line. The device may further include a pulse generating unit having an inverter delay cell coupled to the input line to invert an input signal on the input line. The pulse generating unit may also include an OR gate to receive the input signal and an output of the inverter delay cell and to output a first pulse control signal to control a gate of a second p-type field effect transistor (pFET) of the second push-pull driver, and an AND gate to receive the input signal and the output of the inverter delay cell and to output a second pulse control signal to control a gate of a second n-type field effect transistor (nFET) of the second push-pull driver.

These and other aspects of the present disclosure are discussed in greater detail below in connection with the example figures and accompanying description.

Example input-output systems may present large capacitive loading at a receiver unit, for example, up to 45 pF and greater. For instance, a dual in-line memory module (DIMM) may have two packages on either side of a board. In addition, each package may comprise a plurality of stacked integrated circuit dies containing a plurality of receivers. In order to drive these large loads and achieve a high data rate, a large driver may be used. For instance, in a system with a power supply voltage between 1.2-2 volts (V), an output impedance of 50 ohms or less may be used. However, with output impedance less than 50 ohms or not matching with the impedance of the transmission line, such as a printed circuit board (PCB) trace, this may leave the system with an impedance mismatch at the driver, and overshoot and undershoot in the receiver eye.

Some designs may include a termination load in the receiver(s) to reduce reflection and improve signal integrity. Nevertheless, other designs may utilize unterminated receivers. For instance, in many memory standards, the memory address and control pins at the DIMM are unterminated. In such systems with heavy branching and many receivers, power loss may be reduced by omitting termination loads in the receivers. However, with an unterminated receiver and mismatched driver impedance, a large reflection may be exhibited back and forth between the receiver and driver. For example, since the receiver is unterminated, there may be near 100 percent reflection. This may lead to eye closure, and/or large overshoot and undershoot at the receiver, which violates many DIMM design specifications. To reduce reflection, a matched driver impedance may be used, e.g., a 50 ohm driver to match a 50 ohm link to the receiver, e.g., a printed circuit board (PCB) trace, or the like. However, the data rate may be limited. For instance, an open eye may not be achievable at a receiver with 45 pF loading running at greater than 500 Mbps. Thus, in one example, edge rate control may be used to achieve a slower driver edge rate, resulting in a lower overall data rate.

In one example, the present disclosure describes a device or circuit to adjust driver output impedance such that it drives with lower impedance (a "stronger drive strength") at an early stage of a period/unit interval (UI) of a signal and then switches back to a matched impedance (a higher impedance/"lower drive strength") at a later stage within the period/UI. With a stronger drive strength at the early stage, the driver is able to drive a larger receiver load, while at the same time maintaining a faster edge rate. With impedance matching at the later stage, the reflection that bounces back from the receiver unit may be cancelled out at the driver side. Accordingly, example devices and circuits of the present disclosure, e.g., driver units, are able to drive large loads, and at the same time reduce the reflection so as to achieve a large eye opening and small overshoot/undershoot at the receiver unit.

FIG. 1 illustrates a block diagram of an example circuit or device 100, e.g., a driver unit. Device 100 may include a first push-pull driver 110, a push-pull driver unit 120, and a pulse generating unit 130. The push-pull driver unit 120 may have at least a second push-pull driver 125 that may be in parallel with the first push-pull driver 110 between a positive supply voltage 140 ($V_{DD}$) and a negative supply voltage 145 ($V_{SS}$).

In one example, the first push-pull driver 110 may have a first impedance and the at least second push-pull driver 125 may have a second impedance. In one example, the first impedance may be equal to the second impedance. In another example, the first impedance and the second impedance may be different. In one example, the pulse generating unit 130 may activate the push-pull driver unit 120 (and the second push-pull driver 125) for a delay time following an edge transition, such as low-to-high, or high-to-low, in an input signal received via the input line 150. In one example, the pulse generating unit 130 may activate the push-pull driver unit 120 (and the second push-pull driver 125) via pulse control signals on pulse control lines 138 and 139. In one example, the first push-pull driver 110 and the push-pull driver unit 120 are also coupled to the output line 155. The output line 155 may be coupled to a receiver unit (not shown). In one example, the delay time may be tuned based on receiver capacitive loading and transmission line length. For instance, a longer transmission line may allow a longer duration of time before reflected signal power arrives back at the driver side than for a similar system with a shorter transmission line. In one example, the device 100 may have an output impedance that is less than the impedance of the first push-pull driver 110 when the push-pull driver unit 120 is deactivated, and may have an output impedance that corresponds to the impedance of the first push-pull driver 110 when the push-pull driver unit 120 is deactivated.

Figure 2:
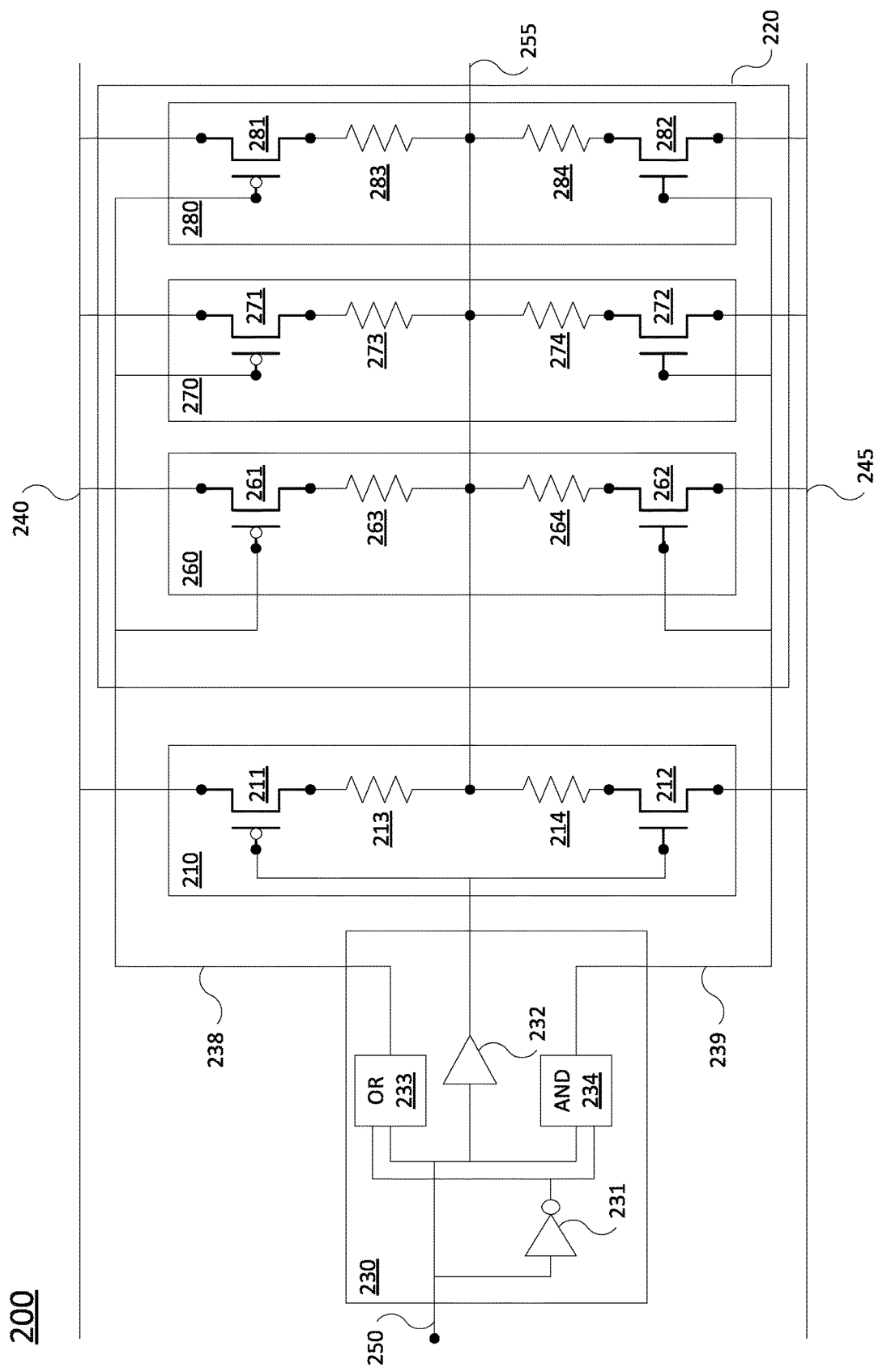
FIG. 2 illustrates an example device including a push-pull driver, a push-pull driver unit, and a pulse generating unit in greater detail.

FIG. 2 illustrates an example circuit or device 200 including a first push-pull driver 210, a push-pull driver unit 220, and a pulse generating unit 230. For example, device 200 may represent an instance of device 100 of FIG. 1 in greater detail. The push-pull driver unit 220 may be activated in parallel to the first-push pull driver 210 during an early phase of a period of a signal to provide a low impedance, "strong driver" to support faster data rates and higher power transmission. During a late phase of the period of the signal, the push-pull driver unit 220 may be deactivated, and the first push-pull driver 210 may provide a matched impedance to attenuate power reflection from a receiver unit.

As illustrated in FIG. 2, the first push-pull driver 210 may include a p-type field effect transistor (pFET) 211, an n-type field effect transistor (nFET) 212, and resistors 213 and 214. In the example device 200, pFET 211 is coupled to positive supply voltage 240 and to resistor 213. Similarly, nFET 212 is coupled to negative supply voltage 245 and to resistor 214. Resistors 213 and 214 are also coupled to output line 255. Output line 255 may be coupled to a receiver unit (not shown). The gates of pFET 211 and nFET 212 may be coupled to an output of buffer 232 of pulse generating unit 230 and may be controlled by an input signal on the input line 250 that is passed through the buffer 232. In one example, the impedances of resistors 213 and 214 may be matched to the impedance of output line 255. For instance, if the impedance of output line 255 is 50 ohms, the resistors 213 and 214 may be 45 ohms, e.g., taking into account a 5 ohm impedance of each of pFET 211 and nFET 212 when activated. Although there are two resistors 213 and 214, only one will be in the current path to the output line 255 at any time, since when the pFET 211 is on, the nFET 212 will be off, and vice versa. Therefore, the effective impedance of the first push-pull driver 210 may remain 50 ohms, alternatively provided by pFET 211 and resistor 313 when the input signal is low, and nFET 212 and resistor 214 when the input signal is high.

Push-pull driver unit 220 may comprise one or a plurality of push-pull drivers. In the example of FIG. 2, there are three push-pull drivers 260, 270 and 280. The push-pull drivers 260, 270, and 280 may have similar configurations to each other and to the first push-pull driver 210. For example, push-pull driver 260 may include pFET 261, nFET 262, and resistors 263 and 264, push-pull driver 270 may include pFET 271, nFET 272, and resistors 273 and 274, and push-pull driver 280 may include pFET 281, nFET 282, and resistors 283 and 284. The pFETs 261, 262, and 263 may be coupled to positive supply voltage 240 and to resistors 263, 273, and 283, respectively. The nFETs 262, 272, and 282 are coupled to negative supply voltage 245 and to resistors 264, 274, and 284, respectively. Thus, the push-pull drivers 260, 270, and 280 are all connected in parallel with each other and with the first push-pull driver 210 between the positive supply voltage 240 and the negative supply voltage 245. The resistors 263, 273, 283, 264, 274, and 284 are also all coupled to the output line 255. However, the gates of the field effect transistors (FETs) of each of the push-pull drivers 260, 270, and 280 are controlled differently from that of the first push-pull driver 210.

In one example, pFETs 261, 271, and 281 may be activated upon a falling edge of an input signal on the input line 250 and deactivated after a delay time. In one example, the delay time may be shorter than a period of the input signal. For instance, the delay time may be one half or less of the period of the input signal, e.g., a third of the duration of the period of the input signal, a quarter of the period of the input signal, and so forth. In one example, the delay time may be tuned based on receiver capacitive loading and a length of a transmission line, e.g., a distance from the output line 455 to a receiver unit (not shown). Similarly, nFETs 262, 272, and 282 may be activated upon a rising edge of the input signal and deactivated after the delay time. To enable these functions, the gates of pFETs 261, 271, and 281 may be coupled to OR gate 233 and receive an output signal of the OR gate 233, e.g., a first pulse control signal via pulse control line 238. The gates of nFETs 262, 272, and 282 may be coupled to AND gate 234 and receive an output signal of AND gate 234, e.g., a second pulse control signal via pulse control line 239.

Figure 3:
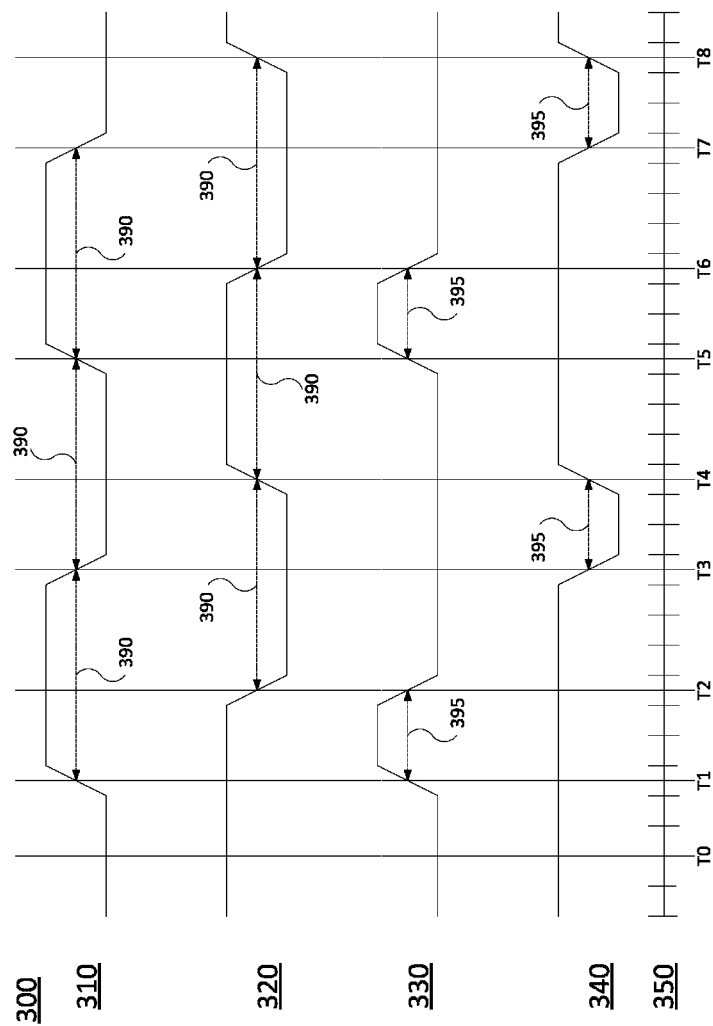
FIG. 3 illustrates an example signal timing diagram for example devices of the present disclosure.

The operations of pulse generating unit 230 are now described in connection with the example signal timing diagram 300 of FIG. 3. As referred to herein, the terms low or zero (0) may be used interchangeably, while the terms high or one (1) may be used interchangeably to refer to binary logic states, e.g., voltage levels, of the respective waveforms 310-340. For instance low/0 may correspond to negative supply voltage 245, while high/1 may correspond to positive supply voltage 240. However, this convention is used for illustrative purposes only and it should be appreciated that different conventions for describing binary logic states and/or voltage levels may be utilized in other examples.

Waveform 310 illustrates an example input signal, e.g., on input line 250. Waveform 310 has a period denoted by the arrows 390. Waveform 310 may also represent the output of buffer 232 that controls the gates of pFET 211 and nFET 212 of the first push-pull driver 210. Thus, when the waveform 310 is low, pFET 211 will be activated and a conductive path provided between the positive supply voltage 240 and the output line 255. When the waveform 310 is high, pFET 211 will be deactivated, and nFET 212 will be activated, providing a conductive path between the negative supply voltage 245 and the output line 255.

As illustrated in FIG. 2, the input line 250 is split into several paths and feeds inverter 231, OR gate 233, AND gate 234, and buffer 232. In one example, the inverter 231 may comprise a delay cell inverter that both inverts and delays the input signal. The example waveform 320 may therefore illustrate the output of inverter 231 in response to the input signal of waveform 310. For instance, the delay may comprise one half or less of the period 390 of the input signal. In one example, the inverter 231, the OR gate 233, and the AND gate 234 may comprise complementary metal-oxide-semiconductor (CMOS) logic. For instance, OR gate 233 may comprise a CMOS-based NOR gate coupled to a CMOS-based NOT gate/inverter, AND gate 234 may comprise a CMOS-based NAND gate coupled to a CMOS-based NOT gate/inverter, and so forth. Other logic configurations may also be used in accordance with the present disclosure.

The output of the inverter 231 may be coupled to the OR gate 233 and to the AND gate 234. Thus, the OR gate 233 and the AND gate 234 both receive the input signal, and a delayed and inverted copy of the input signal, and generate outputs according to the respective logic schemes. At time T0, the waveform 310 for the input signal on input line 250 is low while the waveform 320 for the output of inverter 231 is high. Thus, the output of the AND gate 234, illustrated in waveform 330, is low. Conversely, the output of the OR gate 233, illustrated in waveform 340, is high.

The output of the OR gate 233 (waveform 340) controls the gates of pFETs 261, 271, and 281 via pulse control line 238. Since the pFETs 261, 271, and 281 are coupled to a positive supply voltage 240, a high/1 output of the OR gate 233 (waveform 340) will result in a voltage difference of zero (0) between the gate and source of each of the respective pFETs 261, 271, and 281. In addition, since a pFET is activated with a negative gate-source voltage differential, the pFETs 261, 271, and 281 will remain off/deactivated at time T0. In other words, little to no current will flow across from source to drain across the respective pFETs 261, 271, and 281.

The output of the AND gate 234 (waveform 330) controls the gates of nFETs 262, 272, and 282 via pulse control line 239. Since the nFETs 262, 272, and 282 are coupled to negative supply voltage 245, a low/0 output of the AND gate 234 (waveform 330) results in a voltage difference of zero (0) between the gate and source of each of the respective nFETs 262, 272, and 282. In addition, since an nFET is activated with a positive gate-source voltage differential, the nFETs 262, 272, and 282 also remain deactivated at time T0.

At time T0, since the output of buffer 232 is also low/0 (waveform 310), a negative gate-source voltage different is present at pFET 211 of the first push-pull driver 210. Therefore, pFET 211 is activated at time T0. As such, pFET 211 and resistor 213 will be in the conductive path between positive supply voltage 240 and the output line 255. Since none of the push-pull drivers 260, 270, or 280 is activated, the overall output impedance of the device 200 corresponds to the series impedance of the pFET 211 and the resistor 213. In one example, the series impedance of the pFET 211 and the resistor 213 may be tuned to match an impedance of the output line 255. This may be based upon various factors, such as the length and cross-sectional dimensions of the line, the anticipated operating temperature, and so forth. For example, if the impedance of output line 255 is 50 ohms and the pFET 211 has an impedance of 5 ohms in the saturation region, the resistor may be selected to be 45 ohms, such that the overall series impedance may be 50 ohms.

At time T1, the input signal of waveform 310 transitions high, e.g., a rising edge. Since the output of buffer 232 (waveform 310) is also high, pFET 211 of the first push-pull driver 210 is deactivated/turned off at time T1. However, a positive gate-source voltage differential is present at nFET 212. Therefore, nFET 212 is activated at time T1. As such, nFET 212 and resistor 214 will be in the conductive path between negative supply voltage 245 and the output line 255.

At time T1, both inputs to the OR gate 233 may be high. The output signal of the OR gate 233 (waveform 340) therefore also remains high, and the pFETs 261, 271, and 281 remain deactivated. However, since both the input signal of waveform 310 and the output of the inverter 231 (waveform 320) are both high at time T1, both inputs to AND gate 234 are high. Therefore, the output of AND gate 234 (waveform 330) at time T1 transitions high. In addition, the high/1 output signal from AND gate 234 (waveform 330) causes a positive gate-source voltage differential at nFETs 262, 272, and 282. The nFETs 262, 272, and 282 may therefore be activated and allow current to flow.

In this example, if each of the nFETs 262, 272, and 282 provides a 5 ohm impedance in the saturation region and if each of the resistors 264, 274, and 284 has a 45 ohm impedance, each of the push-pull drivers 260, 270, and 280 may have an effective impedance of 50 ohms (where pFETs 261, 271, and 281 are deactivated, and where little to no current flows through pFETs 261, 271, and 281 and resistors 263, 273, and 283). In addition, the overall output impedance of the device 200 may be 12.5 ohms, since there are four 50 ohm impedances connected in parallel at time T1. A lower output impedance at the beginning of a period (an example period 390 extends from time T1 to time T3), supports a faster edge rate and a greater output power. A faster edge rate allows a shorter period to be used in the system and hence a faster data rate than if a higher output impedance, such as 50 ohms, was present.

At time T2, the output of the inverter 231 (waveform 320) transitions to low, e.g., a falling edge. As mentioned above, the inverter 231 may comprise a delay cell. The time difference between T1 and T2 may therefore comprise the delay time (which also corresponds to the pulse width 395 in waveforms 330 and 340) across the inverter 231. The delay time may be one half or less of the period/UI. For instance, if the period 390 (e.g., between T1 and T3) is 2 nanoseconds (ns), the delay time may be 1 ns or less. In one example, overshoot and undershoot at the receiver end can be minimized by optimizing the delay time, and therefore pulse width 395, based upon the output impedance of device 200 during the pulse and the capacitance on the receiver end. For example, the total charge which a driver, such as device 200, may dump on a receiver capacitor in order to bring the signal level to $V_{DD}$ may depend upon the driver output swing at the pad, which may be $V_{DD}$ divided by the driver impedance and transmission line impedance, and the pulse width 395, where the driver impedance is the output impedance of the driver during the "pulse" that occurs from T1 to T2. Therefore, with a lower output impedance, a shorter pulse width 395 may be selected as compared to a higher output impedance. In an example where resistors 213, 214, 263, 264, 273, 274, 283, and 284 may be 50 ohms, the output impedance of device 200 may be 12.5 ohms when the push-pull driver unit 220 is activated during a "pulse." However, in another example, the output impedance of device 200 may be a different value, such as 10 ohms, 15 ohms, and so forth. Therefore, the pulse width 395 may be optimized to minimize the overshoot and undershoot based upon the particular configurations of various example systems.

Since one of the inputs to AND gate 234 is now low, the output of AND gate 234 also reverts to low. In addition, the low signal output from AND gate 234 causes nFETs 262, 272, and 282 to deactivate (e.g., gate open, with little to no current flow). Since the push-pull drivers 260, 270, and 280 of push-pull driver unit 220 are turned off, the output impedance of the device 200 may revert to the series impedance of nFET 212 and resistor 214 of the first push-pull driver 210, e.g., 50 ohms, which may be matched to the impedance of the output line 255. A matched impedance at a later stage of each period/UI 390 may mitigate reflection. In this case, the "later stage" may comprise the time between T2 and T3. In addition, by controlling and optimizing the pulse width 395 as described above, the overshoot and undershoot can be minimized at the receiver end. For example, the total charge with a driver may dump on a receiver capacitor in order to bring the signal level to $V_{DD}$ depends upon the driver current (which may be $V_{DD}$ divided by the driver impedance) times the pulse width 395. Therefore, the pulse width 395 may be optimized to minimize the overshoot and undershoot.

At time T3, the input signal of waveform 310 transitions low, e.g., a falling edge. The buffer 232 may pass a low signal to the gates of pFET 211 and nFET 212. Accordingly, pFET 211 of the first push-pull driver 210 may be activated/turned on when nFET 212 is deactivated/turned off. The output of inverter 231 (waveform 320) remains low at time T3. As such, both of the inputs to the OR gate 233 are low. The output of the OR gate 233 (waveform 340) therefore transitions low. The low output signal of the OR gate 233 is also propagated to the gates of pFETs 261, 271, and 281. A negative gate-source voltage is present, thereby activating pFETs 261, 271, and 281 and allowing current to flow.

In this example, if each of the pFETs 261, 271, and 281 provides a 5 ohm impedance in the saturation region and if each of the resistors 263, 273, and 283 has a 45 ohm impedance, each of the push-pull drivers 260, 270, and 280 may have an effective impedance of 50 ohms (where nFETs 262, 272, and 282 are deactivated, and where little to no current flows through nFETs 262, 272, and 282 and resistors 264, 274, and 284). In addition, the overall output impedance of the device 200 may be 12.5 ohms, since there are four 50 ohm impedances connected in parallel at time T1. A lower output impedance at the beginning of a period 390 (in this example, the period may extend from time T3 to time T5), supports a greater output power and a faster edge rate, where a faster edge rate also allows the use of faster data rate.

At time T4, the output of the inverter 231 (waveform 320) transitions high (corresponding to the falling edge of the input signal of waveform 310 at time T3, where the time between T3 and T4 may comprise the delay time across the inverter 231). Since one of the inputs to OR gate 233 is now high, the output of OR gate 233 (waveform 340) also reverts to high. In addition, the high signal output from OR gate 233 causes pFETs 261, 271, and 281 to deactivate. Thus, the pulse width 395 may correspond to the delay time across the inverter 231. Since the push-pull drivers 260, 270, and 280 of push-pull driver unit 220 are turned off, the output impedance of the device 200 may revert to the series impedance of pFET 211 and resistor 213 of the first push-pull driver 210, e.g., 50 ohms, which may be matched to the impedance of the output line 255.

Device 200 may continue to operate as outlined above. For instance, at time T5, the input signal on input line 250 (waveform 310) may transition to high/1. The nFET 212 of first push-pull driver 210 maybe activated. The AND gate 234 may output a high/1 (waveform 330) and activate the nFETs 262, 272, and 282. At time T6, the output of inverter 231 (waveform 320) may transition low/0. Since one of the inputs to AND gate 234 is now low/0, AND gate 234 will output low/0 (waveform 330), thereby deactivating nFETs 262, 272, and 282. At time T7 the input signal on input line 250 transitions low/0 (waveform 310). Therefore, nFET 212 of first push-pull driver 210 may be deactivated and pFET 211 may be activated. In addition, since both of the inputs to OR gate 233 are low (waveforms 310 and 320), the OR gate 233 may also output low/0 (waveform 340) and activate pFETs 261, 271, and 281. At time T8, the output of inverter 231 (waveform 320) may transition high/1. Since one of the inputs to OR gate 233 is now high/1, OR gate 233 will output high/1 (waveform 330), thereby deactivating pFETs 261, 271, and 281. Thus, for each period, push-pull driver unit 220 may be activated during an early stage to provide a lower impedance/stronger driver, and deactivated during a late stage to provide a matched impedance for reflection attenuation, mitigation of overshoot and undershoot, and so forth.

Figure 4:
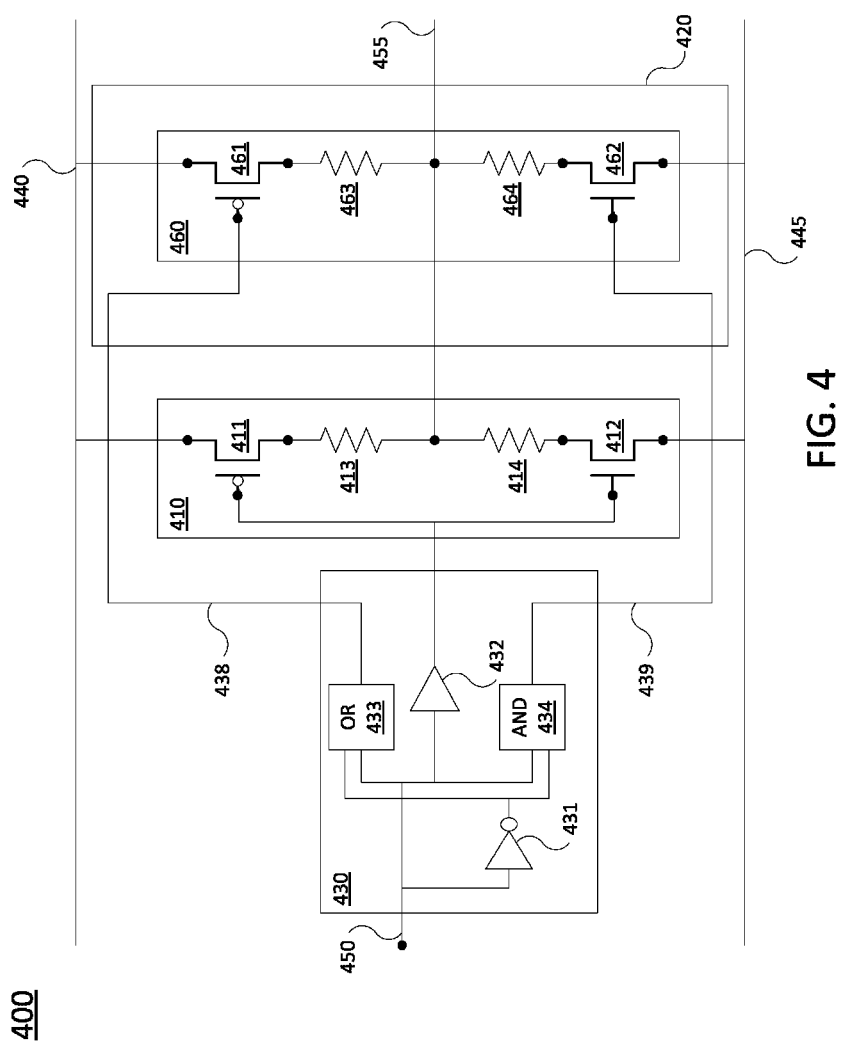
FIG. 4 illustrates an additional example device including a push-pull driver, a push-pull driver unit, and a pulse generating unit in greater detail.

FIG. 4 illustrates an example circuit or device 400 including a first push-pull driver 410, a push-pull driver unit 420, and a pulse generating unit 430. For example, device 400 may represent an instance of device 100 of FIG. 1 in greater detail. The push-pull driver unit 420 may be activated in parallel to the first-push pull driver 410 during an early phase of a period of a signal to provide a low impedance, strong driver to support faster data rates and higher power transmission. During a late phase of the period of the signal, the push-pull driver unit 420 may be deactivated, and the first push-pull driver 410 may provide a matched impedance to attenuate power reflection from a receiver unit (not shown).

In one example, first push-pull driver 410 may be similar to the first push-pull driver 210 of FIG. 2. For instance, first push-pull driver 410 may include a pFET 411, an nFET 412, and resistors 413 and 414. In the example device 400, pFET 411 is coupled to positive supply voltage 440 and to resistor 413. Similarly, nFET 412 is coupled to negative supply voltage 445 and to resistor 414. Resistors 413 and 414 are also coupled to output line 455. Output line 455 may be coupled to a receiver unit (not shown). The gates of pFET 411 and nFET 412 may be coupled to an output of buffer 432 of pulse generating unit 430 and may be controlled by an input signal on the input line 450 that is passed through the buffer 432. In one example, the impedances of resistors 413 and 414 may be matched to the load of output line 255. For instance, if the load of output line 455 is 50 ohms, the resistors 413 and 414 may be 45 ohms, e.g., taking into account a 5 ohm impedance of each of pFET 411 and nFET 412 when activated.

The pulse generating unit 430 may be the same as or similar to the pulse generating unit 230 of FIG. 2. For instance, pulse generating unit 430 may include a delay cell/inverter 431, a buffer 432, an OR gate 433, and an AND gate 434 which perform similar functions to the counterpart components in pulse generating unit 230 of FIG. 2. The push-pull driver unit 420 may function in a similar manner to push-pull driver unit 220 of FIG. 2. However, it may include one push pull driver, e.g., second push-pull driver 460, instead of a plurality of push-pull drivers as in the example device 200 of FIG. 2. For example, as illustrated in FIG. 4, the second push-pull driver 460 may include a pFET 461, an nFET 462, and resistors 463 and 464. The gates of pFET 461 and nFET 462 may be coupled to and controlled by OR gate 433 and AND gate 434, respectively. For instance OR gate 433 and AND gate 434 may output respective pulse control signals on pulse control lines 438 and 439, respectively. In one example, the operations of device 400 may be represented by the timing diagram 300 of FIG. 3 in a similar manner as described above in connection with the example device 200 of FIG. 2.

However, in one example, the resistors 463 and 464 may have impedances that are less than a matched impedance for output line 455. For instance, if the impedance of the output line is 50 ohms, resistors 413 and 414 of the first push-pull driver 410 may be selected to be 45 ohms (assuming pFET 411 and nFET 412 have 5 ohm impedances in the saturation region), while resistors 463 and 464 may be selected to be 5 ohms. To illustrate, if pFET 461 and nFET 462 exhibit 5 ohm impedance in the respective saturation regions, the effective impedance of push-pull driver unit 420 and second push-pull driver 460 may be 10 ohms when activated, where the 10 ohm impedance may be provided by pFET 461 in series with resistor 463 when pFET 461 is activated/turned on, and provided by nFET 462 in series with resistor 464 when nFET 462 is activated/turned on.

To further illustrate, if pFET 411 and pFET 461 are both activated, there may be two conductive paths in parallel from the positive voltage supply 440 and the output line 455, where the first conductive path may have an impedance of 50 ohms, while the second conductive path may have an impedance of 10 ohms. Thus, the effective output impedance of device 400 at such time may be equal to or approximately 8.3 ohms. Similarly, if nFET 412 and nFET 462 both activated, there may be two conductive paths in parallel from the negative voltage supply 445 and the output line 455, where the first conductive path may have an impedance of 50 ohms and the second conductive path may have an impedance of 10 ohms. Thus, the effective output impedance of device 400 at such time may also be 8.3 ohms. At other times, the push-pull driver unit 420 and the second push pull driver 460 may be deactivated (both pFET 461 and nFET 462 deactivated). Therefore, the effective output impedance of device 400 may be 50 ohms, provided by either pFET 411 in series with resistor 413, or nFET 412 in series with resistor 414.

The example device 400 of FIG. 4 may occupy less space than the example device 200 of FIG. 2 since it utilizes fewer components in the push-pull driver unit 420. However, the example of FIG. 2 may have better impedance control and linearity with process, voltage, and temperature (PVT) variations, since the example of FIG. 2 is resistor-driven (e.g., where the output impedance is more depended upon the impedance of the resistors), whereas the example of FIG. 4 is transistor-driven (e.g., the output impedance is more dependent upon the transistor impedances). For instance, during manufacturing, resistors may have better consistency with respect to PVT as compared to transistors.

It should be appreciated that the foregoing description is provided for illustrative purposes and that other, further and, different examples may be implemented in the same or in similar systems. Any specific values for voltages, capacitances, impedances, data rates, and the like are given by way of example only. Thus, in other, further, and different examples, different values may be utilized for various components. In addition, aspects of different examples provided above may be combined, rearranged, or omitted for various purposes. For instance, although FIG. 2 illustrates an example where the push-pull driver unit 220 includes three push-pull drivers in parallel, other examples may utilize more or less push-pull drivers, e.g., two push-pull drivers in parallel, five push-pull drivers in parallel, and so forth. In addition, the resistors in push-pull drivers of the present disclosure may be matched (e.g., resistors 213, 214, 263, 273, 283, 264, 274, and 284 in FIG. 2 may all be 50 ohms, or another impedance value). However, in other examples, the resistors may not necessarily have the same impedances from one push-pull driver to the next. In still another example, multiple resistors in series or in parallel may be used in place of a single resistor as illustrated in FIG. 2 or in FIG. 4. Other modifications of a similar nature may be made in accordance with the present disclosure.

In addition, the example devices of the present disclosure are not data-dependent. For instance, there may be many zeros in a row followed by a one, and the pulsing of a push-pull driver unit (e.g., activation and deactivation of one of the pFET or nFET) will occur on the edge transitions. Thus, examples of the present disclosure may be used in connection with both level-triggered and edge-triggered logic, and so forth. In addition, the present disclosure is not limited to memory driver applications, but is broadly applicable to impedance matching and impedance tuning for data transfer from a driver to a receiver. Thus, variants of the above-disclosed and other features and functions, or alternatives thereof, may be omitted, or may be combined or altered into many other different systems or applications.

What is claimed is:

1. A device, comprising:
   a first push-pull driver with a first impedance;
   a push-pull driver unit with a second push-pull driver having a second impedance, the push-pull driver unit in parallel with the first push-pull driver; and
   a pulse generating unit to activate the push-pull driver unit for a delay time following an edge transition in an input signal, the device having an output impedance that is less than the first impedance when the push-pull driver unit is activated.

2. The device of claim 1, the first push-pull driver comprising:
   a first p-type field effect transistor (pFET);
   a first resistor;
   a first n-type field effect transistor (nFET); and
   a second resistor, the first pFET coupled to a positive supply voltage and the first resistor, the first nFET coupled to a negative supply voltage and the second resistor, the first resistor and the second resistor coupled to an output line, and a gate of the first pFET and a gate of the first nFET coupled to an input line for the input signal.

3. The device of claim 2, the first resistor and the second resistor having the first impedance.

4. The device of claim 2, the second push-pull driver comprising:
   a second p-type field effect transistor (pFET);
   a third resistor;
   a second n-type field effect transistor (nFET); and
   a fourth resistor, the second pFET coupled to the positive supply voltage and the third resistor, the second nFET coupled to the negative supply voltage and the fourth resistor, the third resistor and the fourth resistor coupled to the output line, a gate of the second pFET coupled to a first pulse control line from the pulse generating unit, and a gate of the second nFET coupled to a second pulse control line from the pulse generating unit.

5. The device of claim 4, the third resistor and the fourth resistor having the second impedance.

6. The device of claim 4, the pulse generating unit comprising:
   an inverter to invert the input signal;
   an OR gate to:
      receive the input signal and an output of the inverter; and output a first pulse control signal on the first pulse control line to control a gate of the second pFET; and an AND gate to:
receive the input signal and the output of the inverter; and output a second pulse control signal on the second pulse control line to control a gate of the second nFET.

7. The device of claim 6, the inverter comprising a delay cell, the delay time corresponding to a delay across the inverter.

8. The device of claim 1, the delay time is selected based upon the output impedance of the device when the push-pull driver unit is activated.

9. The device of claim 1, the output impedance corresponding to the first impedance when the push-pull driver unit is deactivated.

10. The device of claim 1, the push-pull driver unit having at least one additional push-pull driver, the at least one additional push-pull driver having at least a third impedance.

11. The device of claim 10, the at least a third impedance corresponding to the first impedance and the second impedance.

12. A device, comprising:
a first push-pull driver with a first impedance;
a second push-pull driver having a second impedance, the second push-pull driver in parallel with the first push-pull driver; and
a pulse generating unit to activate the second push-pull driver for a delay time following an edge transition in an input signal, the device having an output impedance that is less than the first impedance when the second push-pull driver is activated.

13. The device of claim 12, the first push-pull driver comprising:
a first resistor coupled to an output terminal;
a second resistor coupled to the output terminal;
a first p-type field effect transistor (pFET) coupled to a positive power supply and to the first resistor, a gate of the first pFET controlled by a first pulse control signal from the pulse generating unit; and
a first n-type field effect transistor (nFET) coupled to a negative power supply and to the second resistor, a gate of the first nFET controlled by a second pulse control signal from the pulse generating unit.

14. A device, comprising:
a first push-pull driver having a first impedance, the first push-pull driver coupled to a positive power supply and a negative power supply, gates of a first p-type field effect transistor (pFET) and a first n-type field effect transistor (nFET) of the first push-pull driver coupled to an input line of the device;
a second push-pull driver coupled to the positive power supply and the negative power supply in parallel with the first push-pull driver, the second push-pull driver having a second impedance, the first push-pull driver and the second push-pull driver coupled to an output line; and
a pulse generating unit comprising:
an inverter delay cell coupled to the input line, to invert an input signal on the input line;
an OR gate to:
receive the input signal and an output of the inverter delay cell; and
output a first pulse control signal to control a gate of a second p-type field effect transistor (pFET) of the second push-pull driver; and
an AND gate to:
receive the input signal and the output of the inverter delay cell; and
output a second pulse control signal to control a gate of a second n-type field effect transistor (nFET) of the second push-pull driver.

15. The device of claim 14, the device having an output impedance that is less than the first impedance when the second push-pull driver is activated, the second push-pull driver being activated when one of the second pFET or the second nFET of the second push-pull driver enables a current to flow to or from one of the positive power supply or the negative power supply.

16. The device of claim 1, wherein the delay time is selected based on at least one of a capacitive loading of a receiver unit to which the device is coupled and a transmission length between the device and the receiver unit.

17. The device of claim 12, wherein the delay time is selected based on a capacitive loading of a receiver unit to which the device is coupled.

18. The device of claim 12, wherein the delay time is selected based on a transmission length between the device and a receiver unit to which the device is coupled.

19. The device of claim 12, wherein the delay time is shorter than a period of the input signal.

20. The device of claim 19, wherein the delay time is one half the period of the input signal.

* * * * *